United States Patent
Ohta et al.

(10) Patent No.: US 11,930,713 B2
(45) Date of Patent: Mar. 12, 2024

(54) PIEZOELECTRIC ELEMENT AND VIBRATING DEVICE

(71) Applicant: TDK CORPORATION, Tokyo (JP)

(72) Inventors: Yoshiki Ohta, Tokyo (JP); Hideya Sakamoto, Tokyo (JP); Kazushi Tachimoto, Tokyo (JP); Yoshikazu Shimura, Tokyo (JP); Tetsuyuki Taniguchi, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1033 days.

(21) Appl. No.: 16/373,749

(22) Filed: Apr. 3, 2019

(65) Prior Publication Data

US 2019/0312190 A1  Oct. 10, 2019

(30) Foreign Application Priority Data

Apr. 4, 2018  (JP) ................. 2018-072368

(51) Int. Cl.
  *H10N 30/50*  (2023.01)
  *H10N 30/20*  (2023.01)
  *H10N 30/87*  (2023.01)
  *H10N 30/88*  (2023.01)

(52) U.S. Cl.
  CPC ......... *H10N 30/508* (2023.02); *H10N 30/206* (2023.02); *H10N 30/871* (2023.02); *H10N 30/88* (2023.02)

(58) Field of Classification Search
  None
  See application file for complete search history.

(56) References Cited

U.S. PATENT DOCUMENTS

2007/0120448 A1* 5/2007 Miyoshi ............... H10N 30/074
                                                        310/366
2013/0155155 A1   6/2013 Furihata
2016/0163956 A1* 6/2016 Lee ..................... H03H 9/1021
                                                        310/321

FOREIGN PATENT DOCUMENTS

| JP | 2013-077636 A | 4/2013 | |
| JP | 2013-131572 A | 7/2013 | |
| JP | 2015-057838 A | 3/2015 | |
| JP | 2016-051894 A | 4/2016 | |
| WO | WO-2012083980 A1 * | 6/2012 | .......... B41J 2/04561 |

* cited by examiner

*Primary Examiner* — Erica S Lin
(74) *Attorney, Agent, or Firm* — Oliff PLC

(57) ABSTRACT

A piezoelectric element includes a piezoelectric body, an electrode layer, and a reinforcing layer. The piezoelectric body has a first main surface, a second main surface, and a side surface. The first main surface and the second main surface oppose each other. The side surface extends in an opposing direction in which the first main surface and the second main surface oppose each other in such a way as to connect the first main surface and the second main surface. The electrode layer is provided in the piezoelectric body. The reinforcing layer is provided on the first main surface. The electrode layer is provided opposing the first main surface and apart from the side surface. When viewed from the opposing direction, the electrode layer has a corner. When viewed from the opposing direction, the reinforcing layer overlaps the corner.

10 Claims, 7 Drawing Sheets

PIEZOELECTRIC ELEMENT AND VIBRATING DEVICE

TECHNICAL FIELD

An aspect of the present invention relates to a piezoelectric element and a vibrating device.

BACKGROUND

For example, in Japanese Unexamined Patent Publication No. 2016-51894, described is a piezoelectric element including a plurality of electrode layers and a piezoelectric layer interposed between the electrode layers. In such a piezoelectric element, each of the electrode layers includes a main electrode and a connection electrode that have different polarities. The main electrodes and the connection electrodes of the electrode layers adjacent to each other are electrically connected through vias penetrating the piezoelectric layer. This piezoelectric element is driven by displacement of an active region that is located between the main electrodes in the piezoelectric layer and is piezoelectrically active.

SUMMARY

In the piezoelectric element, an outer edge of each of the main electrodes serves as a boundary between the active region and an inactive region that is piezoelectrically inactive. Accordingly, stress produced by the displacement during the driving tends to be concentrated on the outer edge, particularly a corner, of the main electrode. This may cause cracks originating from the corner of the main electrode in the piezoelectric layer.

An aspect of the present invention provides a piezoelectric element and a vibrating device capable of suppressing cracks.

A piezoelectric element according to an aspect of the present invention includes a piezoelectric body, an electrode layer, and a reinforcing layer. The piezoelectric body has a first main surface, a second main surface, and a side surface. The first main surface and the second main surface oppose each other. The side surface extends in an opposing direction in which the first main surface and the second main surface oppose each other in such a way as to connect the first main surface and the second main surface. The electrode layer is provided in the piezoelectric body. The reinforcing layer is provided on the first main surface. The electrode layer is provided opposing the first main surface and apart from the side surface. When viewed from the opposing direction, the electrode layer has a corner. When viewed from the opposing direction, the reinforcing layer overlaps the corner.

In the aspect, the reinforcing layer overlapping the corner of the electrode layer is provided on the first main surface when viewed from the opposing direction in which the first main surface and the second main surface of the piezoelectric element oppose each other. Therefore, for example, even when an active region is formed between this electrode layer and another electrode layer, and the outer edge of this electrode layer serves as a boundary between the active region and an inactive region, it is possible to suppress concentration, on the corner of this electrode layer, of stress produced by displacement during driving. This in turn makes it possible to suppress cracks in the piezoelectric body.

In the aspect, the reinforcing layer may have a first region overlapping the corner and a second region adjacent to the corner outside the electrode layer when viewed from the opposing direction. This configuration makes it possible to effectively suppress cracks originating from the corner of the electrode layer.

In the aspect, when viewed from the opposing direction, the electrode layer may have a rectangular shape, and the first main surface may be provided with four reinforcing layers corresponding to four corners of the electrode layer. This configuration makes it possible to reliably suppress cracks in the piezoelectric body.

In the aspect, the corner may be round. This configuration makes it possible to further suppress concentration, on the corner of the electrode layer, of stress produced by the displacement during driving. This in turn makes it possible to further suppress cracks in the piezoelectric body.

In the aspect, the reinforcing layer may be harder than the piezoelectric body. This configuration makes it possible to further suppress cracks in the piezoelectric body.

In the aspect, the piezoelectric body may have a piezoelectric layer disposed between the electrode layer and the first main surface. The piezoelectric layer may have transparency allowing the electrode layer to be visually recognized through the piezoelectric layer. This configuration allows the electrode layer to be visually recognized through the piezoelectric layer. Therefore, it is easy to provide the reinforcing layer at a position overlapping the corner.

In the aspect, the reinforcing layer may have a third main surface protruding from the first main surface, and a fourth main surface opposing the third main surface and buried in the piezoelectric body. This configuration makes it possible to suppress peeling off of the reinforcing layer from the first main surface.

A vibrating device according to an aspect of the present invention includes the piezoelectric element and a vibrating member to which the piezoelectric element is bonded.

Since the vibrating device according to the aspect includes the piezoelectric element, it is possible to suppress cracks in the piezoelectric body.

DETAILED DESCRIPTION

Figure 1:
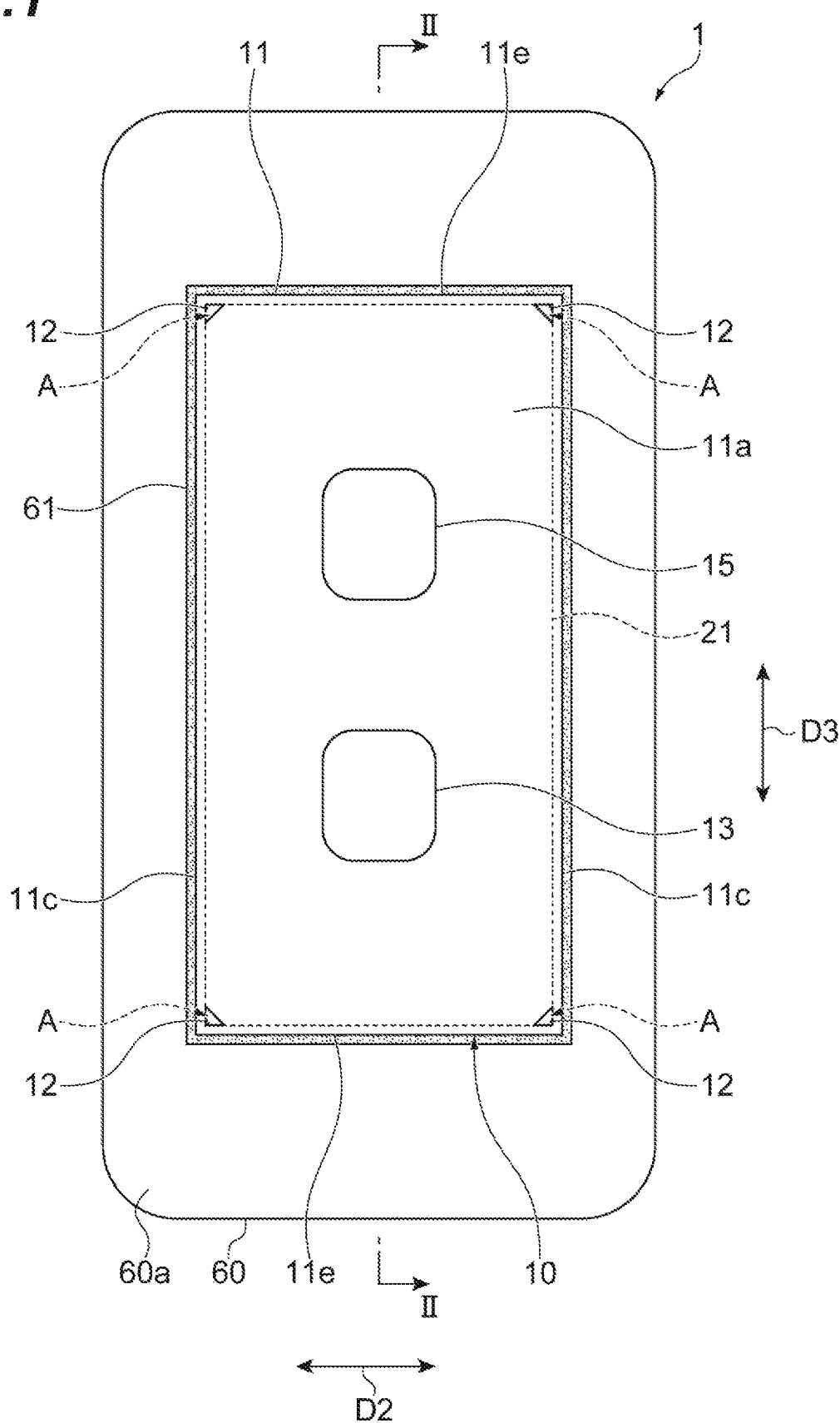
FIG. 1 is a plan view of a vibrating device according to an embodiment.

Hereinafter, an embodiment will be described in detail with reference to the accompanying drawings. Note that, in the description, the same reference numerals are used for the same elements or elements having the same functions, and redundant description will be omitted.

Figure 2:
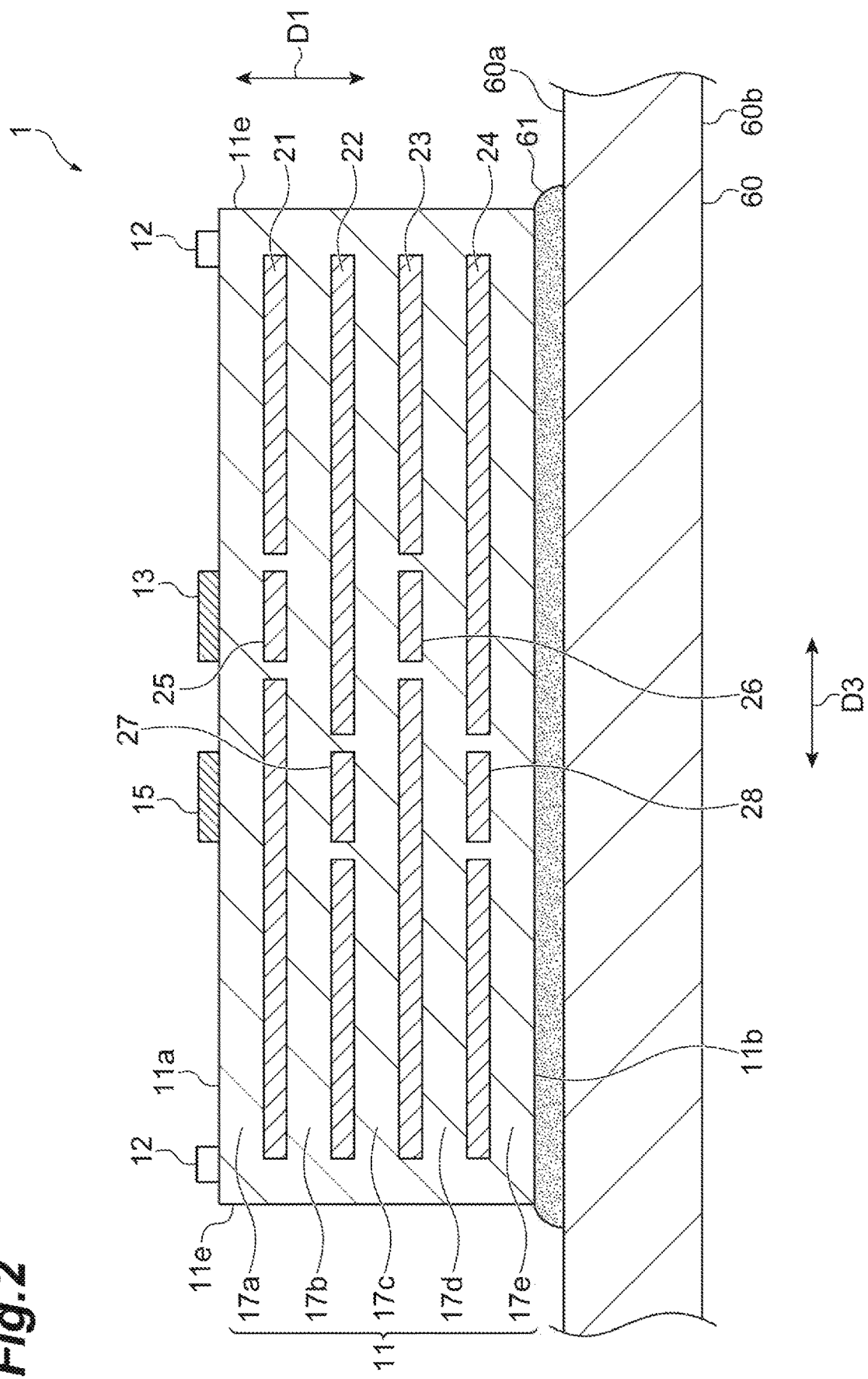
FIG. 2 is a cross-sectional view taken along line II-II of FIG. 1.
Figure 3:
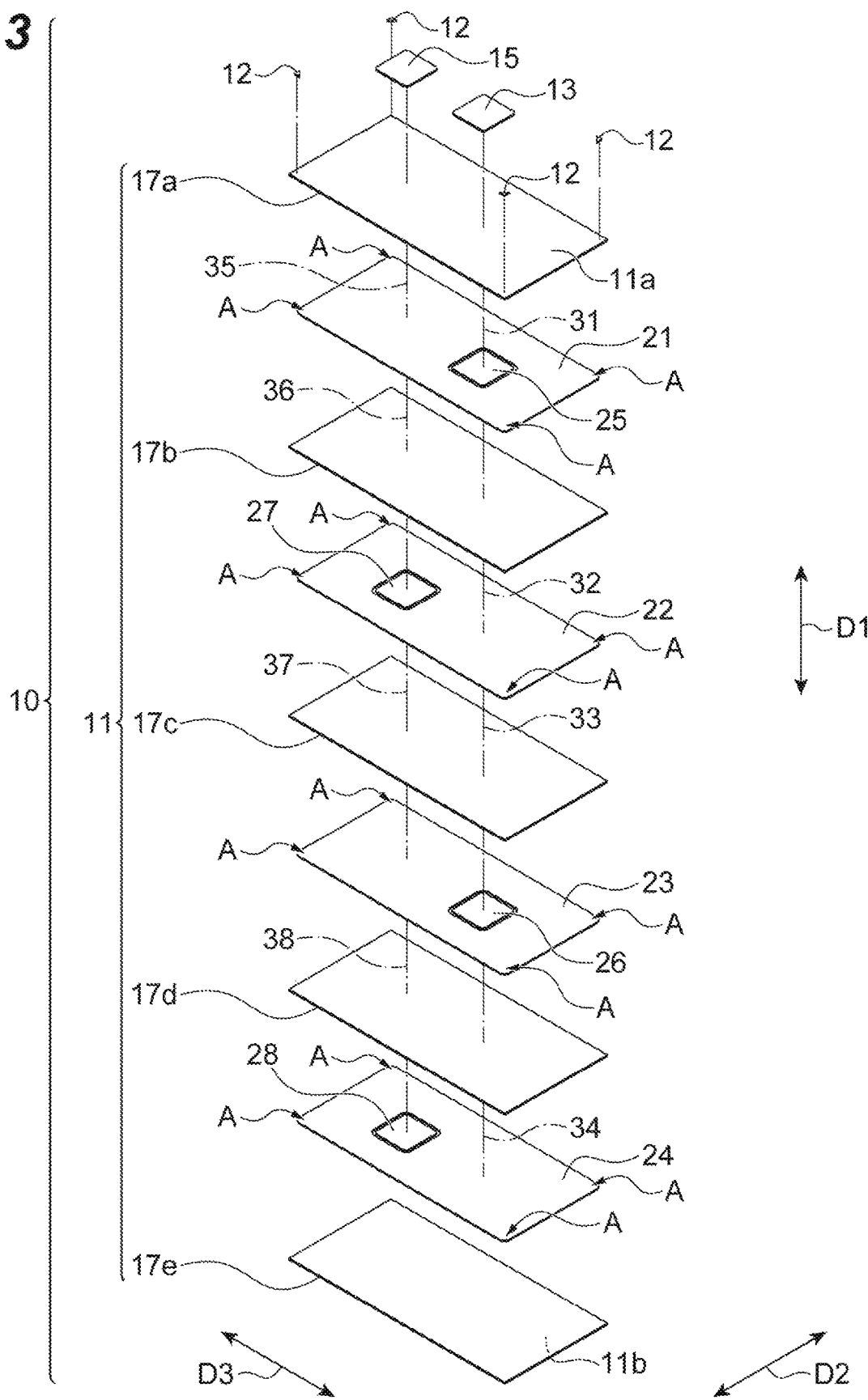
FIG. 3 is an exploded perspective view of a piezoelectric element of FIG. 1.

FIG. 1 is a plan view of a vibrating device according to an embodiment. FIG. 2 is a cross-sectional view taken along line II-II of FIG. 1. FIG. 3 is an exploded perspective view of a piezoelectric element of FIG. 1. As shown in FIG. 1 to FIG. 3, a vibrating device 1 according to the embodiment includes a piezoelectric element 10 and a vibrating member 60. The piezoelectric element 10 includes a piezoelectric body 11, a plurality of reinforcing layers 12, and a plurality of external electrodes 13, 15. In the present embodiment, the piezoelectric element 10 includes four reinforcing layers 12 and a pair of external electrodes 13, 15.

The piezoelectric body 11 has a rectangular parallelepiped shape. The piezoelectric body 11 has a pair of main surfaces 11a, 11b opposing each other, a pair of side surfaces 11c opposing each other, and a pair of side surfaces 11e opposing each other. Examples of the rectangular parallelepiped shape include a rectangular parallelepiped shape whose corners and ridges are chamfered, and a rectangular parallelepiped shape whose corners and ridges are rounded. A direction in which the pair of main surfaces 11a, 11b opposing each other is a first direction D1. The first direction D1 also refers to a direction orthogonal to each of the main surfaces 11a, 11b. A direction in which the pair of side surfaces 11c opposing each other is a second direction D2. The second direction D2 also refers to a direction orthogonal to each of the side surfaces 11c. A direction in which the pair of side surfaces 11e opposing each other is a third direction D3. The third direction D3 also refers to a direction orthogonal to each of the side surfaces 11e.

Each of the main surfaces 11a, 11b has a rectangular shape. Each of the main surfaces 11a, 11b has an oblong shape having a pair of long sides and a pair of short sides. That is, the piezoelectric element 10 (piezoelectric body 11) has an oblong shape having a pair of long sides and a pair of short sides in plan view. Examples of the oblong shape include a shape whose corners are chamfered and a shape whose corners are rounded. In the present embodiment, a long-side direction of the main surfaces 11a, 11b coincides with the third direction D3. A short-side direction of the main surfaces 11a, 11b coincides with the second direction D2.

The pair of side surfaces 11c extend in the first direction D1 in such a way as to connect the pair of main surfaces 11a, 11b. The pair of side surfaces 11c also extend in the third direction D3. The pair of side surfaces 11e extend in the first direction D1 in such a way as to connect the pair of main surfaces 11a, 11b. The pair of side surfaces 11e also extend in the second direction D2. A length in the second direction D2 of the piezoelectric body 11 is, for example, 10 mm. A length in the third direction D3 of the piezoelectric body 11 is, for example, 20 mm. A length in the first direction D1 of the piezoelectric body 11 is, for example, 200 pin. Each of the main surfaces 11a, 11b may be indirectly adjacent to the side surfaces 11c, 11e. In this configuration, ridges are located between each of the main surfaces 11a, 11b and the side surfaces 11c, 11e.

The piezoelectric body 11 is constituted by laminating a plurality of piezoelectric layers 17a, 17b, 17c, 17d, 17e in the first direction D1. The piezoelectric body 11 includes the plurality of piezoelectric layers 17a, 17b, 17c, 17d, 17e that are laminated. In the present embodiment, the piezoelectric body 11 includes five piezoelectric layers 17a, 17b, 17c, 17d, 17e. In the piezoelectric body 11, a direction in which the plurality of piezoelectric layers 17a, 17b, 17c, 17d, 17e are laminated coincides with the first direction D1. The piezoelectric layer 17a has the main surface 11a. The piezoelectric layer 17e has the main surface 11b. The piezoelectric layers 17b, 17c, 17d are located between the piezoelectric layer 17a and the piezoelectric layer 17e.

Each of the piezoelectric layers 17a, 17b, 17c, 17d, 17e is made of a piezoelectric ceramic material. That is, the piezoelectric body 11 is made of the piezoelectric ceramic material. Examples of the piezoelectric ceramic material include PZT[Pb(Zr,Ti)O$_3$], PT(PbTiO$_3$), PLZT[(Pb,La)(Zr,Ti)O$_3$], and barium titanate (BaTiO$_3$). Each of the piezoelectric layers 17a, 17b, 17c, 17d, 17e is constituted by, for example, a sintered body of a ceramic green sheet containing the above-described piezoelectric ceramic material. In the actual piezoelectric body 11, the piezoelectric layers 17a, 17b, 17c, 17d, 17e are integrated in such a way that boundaries between the piezoelectric layers 17a, 17b, 17c, 17d, 17e cannot be visually recognized.

A length (thickness) of each of the piezoelectric layers 17a, 17b, 17c, 17d, 17e in the first direction D1 is 16 μm, for example. The piezoelectric layer 17a disposed between an electrode layer 21 and the main surface 11a has transparency allowing the electrode layer 21 to be visually recognized through the piezoelectric layer 17a from the main surface 11a. The other piezoelectric layers 17b, 17c, 17d, 17e have the same transparency as the piezoelectric layer 17a has.

The piezoelectric element 10 includes a plurality of electrode layers 21, 22, 23, 24 provided in the piezoelectric body 11. In the present embodiment, the piezoelectric element 10 includes four electrode layers 21, 22, 23, 24. Each of the electrode layers 21, 22, 23, 24 is an internal electrode. Each of the electrode layers 21, 22, 23, 24 is made of a conductive material. Examples of the conductive material include Ag, Pd, and an Ag—Pd alloy. Each of the electrode layers 21, 22, 23, 24 is constituted as, for example, a sintered body of a conductive paste containing the above-described conductive material.

The electrode layers 21, 22, 23, 24 are disposed at different positions (layers) in the first direction D1. The main surface 11a and the electrode layer 21 oppose each other with a gap interposed therebetween in the first direction D1. The electrode layer 21 and the electrode layer 22 oppose each other with a gap interposed therebetween in the first direction D1. The electrode layer 22 and the electrode layer 23 oppose each other with a gap interposed therebetween in the first direction D1. The electrode layer 23 and the electrode layer 24 oppose each other with a gap interposed therebetween in the first direction D1. The electrode layer 24 and the main surface 11b oppose each other with a gap interposed therebetween in the first direction D1.

The electrode layer 21 is located between the piezoelectric layer 17a and the piezoelectric layer 17b. The electrode layer 22 is located between the piezoelectric layer 17b and the piezoelectric layer 17c. The electrode layer 23 is located between the piezoelectric layer 17c and the piezoelectric layer 17d. The electrode layer 24 is located between the piezoelectric layer 17d and the piezoelectric layer 17e. None of the electrode layers 21, 22, 23, 24 is exposed to a surface of the piezoelectric body 11. That is, each of the electrode layers 21, 22, 23, 24 is provided apart from the side surfaces 11c and the side surfaces 11e, and none of the electrode layers 21, 22, 23, 24 is exposed to the side surfaces 11c and the side surfaces 11e. Each of the electrode layers 21, 22, 23, 24 is apart from all edges (four sides) of the main surfaces 11a, 11b when viewed from the first direction D1.

Each of the electrode layers 21, 22, 23, 24 has a rectangular shape when viewed from the first direction D1. Each of the electrode layers 21, 22, 23, 24 has an oblong shape having a pair of long sides and a pair of short sides when viewed from the first direction D1 (in plan view). In the present embodiment, the long-side direction of each of the electrode layers 21, 22, 23, 24 coincides with the third direction D3. The short-side direction of each of the electrode layers 21, 22, 23, 24 coincides with the second direction D2. When viewed from the first direction D1, outer edges of the electrode layers 21, 22, 23, 24 have the same shape and are aligned with each other.

The electrode layer 21 has four corners A when viewed from the first direction D1. Each of the corners A has a round shape that is round when viewed from the first direction D1. Here, such a round corner corresponds to a curved corner formed by connection of curved ends of two straight lines rather than a corner formed by intersection of two straight lines. When viewed from the first direction D1, each of the round corners A of the electrode layer 21 is a curved corner formed by connection of curved ends of two straight lines, extending along the side surface 11c and the side surface 11e, of the outer edge of the electrode layer 21. In the present embodiment, each of the electrode layers 22, 23, 24 has four round corners A when viewed from the first direction D1, like the electrode layer 21. Note that each of the corners A may be a corner formed by intersection of two straight lines. In a case where the corner A is a round corner, the corner A includes at least some or all of curves forming the corner A. When the corner A is a corner formed by intersection of two straight lines, the corner A includes at least the intersection and ends of the two straight lines forming the corner A.

The reinforcing layers 12 are provided on the main surface 11a. The reinforcing layers 12 are apart from all the edges (four sides) of the main surface 11a when viewed from the first direction D1. In the present embodiment, the four reinforcing layers 12 each associated with a corresponding one of the four corners A of the electrode layer 21 are provided on the main surface 11a. The four reinforcing layers 12 are apart from each other. Each of the reinforcing layers 12 is provided in such a way as to overlap a corresponding one of the corners A when viewed from the first direction D1. Each of the reinforcing layers 12 is provided in such a way as to be apart from the external electrodes 13, 15 and to overlap only a corresponding one of the corners A and the vicinity of the corner A when viewed from the first direction D1. That is, any of the reinforcing layers 12 is not provided at a center portion of the main surface 11a. The center portion of the main surface 11a is exposed from the reinforcing layers 12. Accordingly, even when a wiring member (not shown) electrically connected to the external electrodes 13, 15 is provided on the main surface 11a, the reinforcing layers 12 are unlikely to come into contact with the wiring member.

Figure 4:
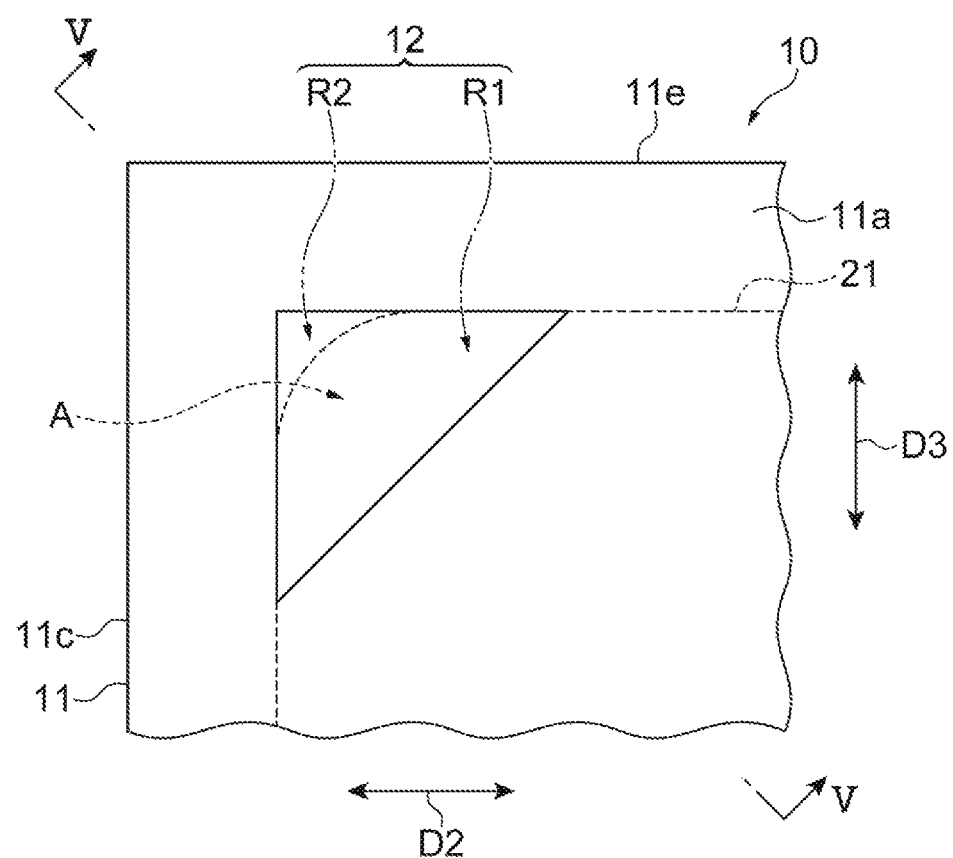
FIG. 4 is a partially enlarged view of FIG. 1.
Figure 5:
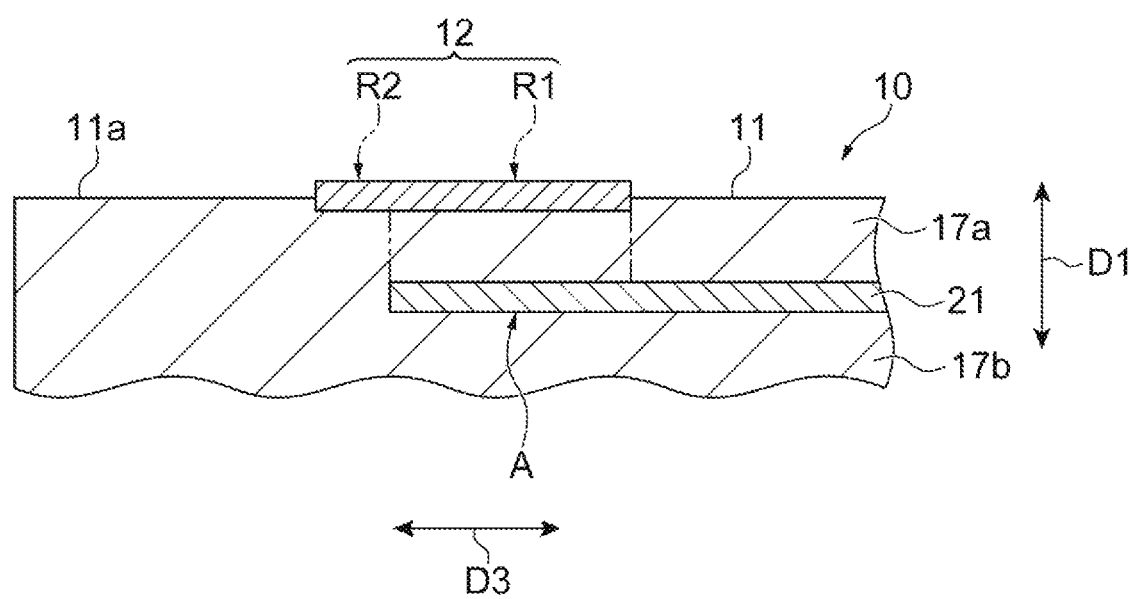
FIG. 5 is a cross-sectional view taken along line V-V of FIG. 4.

FIG. 4 is a partially enlarged view of FIG. 1. FIG. 5 is a cross-sectional view taken along line V-V of FIG. 4. In FIG. 4 and FIG. 5, illustration of the vibrating member 60 and a resin layer 61 to be described later has been omitted. As shown in FIG. 4 and FIG. 5, each of the reinforcing layers 12 has a triangular shape when viewed from the first direction D1. The reinforcing layer 12 has a main surface 12a and a main surface 12b opposing each other in the first direction D1. The reinforcing layer 12 is partially buried in the piezoelectric body 11 in the thickness direction (first direction D1). The main surface 12a protrudes from the main surface 11a of the piezoelectric body 11. The main surface 12b is buried in the piezoelectric body 11. The main surface 12b is located inside the piezoelectric body 11 and deeper than the main surface 11a.

A thickness (length in the first direction D1) of the protruding portion of the reinforcing layer 12 protruding from the main surface 11a is set greater than a thickness (length in the first direction D1) of the buried portion of the reinforcing layer 12 buried in the piezoelectric body 11 from the main surface 11a. The thickness of the buried portion is set to, for example, 2 to 15% of the sum of the thickness of the protruding portion and the thickness of the buried portion. When the reinforcing layer 12 is buried too much in the piezoelectric body 11, that is, the thickness of the buried portion is too large, deformation of the electrode layers 21, 22, 23, 24 provided in the piezoelectric body 11 may result in a decrease in reliability and a variation in piezoelectric characteristics. When the thickness of the buried portion is too small, the reinforcing layer 12 may be peeled off.

The reinforcing layer 12 has a first region R1 overlapping the corner A and a second region R2 adjacent to the corner A outside the electrode layer 21 when viewed from the first direction D1. The first region R1 and the second region R2 are continuous with each other. The reinforcing layer 12 is harder than the piezoelectric body 11. For example, the reinforcing layer 12 is higher in Young's modulus than the piezoelectric body 11. The reinforcing layer 12 is made of, for example, a conductive material. Examples of the conductive material include Ag, Pd, and an Ag—Pd alloy. The reinforcing layer 12 is constituted as, for example, a sintered body of a conductive paste containing the above-described conductive material.

The reinforcing layer 12 results from, for example, applying the conductive paste to a green sheet to be the piezoelectric layer 17a and then firing the conductive paste together with the green sheet. The conductive paste is applied to the green sheet by screen printing, for example. The green sheet is fired in a state of a laminate green. The laminate green results from laminating the green sheets and pressing the green sheets in a laminating direction. The pressing causes the conductive paste to be the reinforcing layer 12 to be partially buried in the green sheets in the thickness direction. The pressing can be performed by, for example, a warm isostatic press (WIP). Conditions of the warm isostatic press include, for example, a water temperature of about 65° C. and a pressure of about 80 MPa. The pressing may be performed by not only the warm isostatic press but also a uniaxial press with a mold, for example.

As shown in FIG. 1 to FIG. 3, each of the external electrodes 13, 15 is disposed on the main surface 11a. The external electrode 13 and the external electrode 15 are aligned in the third direction D3. The external electrode 13 and the external electrode 15 are adjacent to each other in the third direction D3. Each of the external electrodes 13, 15 is apart from all the edges (four sides) of the main surface 11a when viewed from the first direction D1. Each of the external electrodes 13, 15 has a rectangular shape when viewed from the first direction D1. Examples of the rectangular shape include a shape whose corners are chamfered and a shape whose corners are rounded. Each of the external electrodes 13, 15 is made of a conductive material. Examples of the conductive material include Ag, Pd, and an Ag—Pd alloy. Each of the external electrode 13, 15 is constituted as, for example, a sintered body of a conductive paste containing the above-described conductive material.

The external electrode 13 is electrically connected to a connection conductor 25 through a via conductor 31. The connection conductor 25 is located in the same layer that the electrode layer 21 is located. The connection conductor 25 is located inside the electrode layer 21. An opening is formed through the electrode layer 21 at a position corresponding to the external electrode 13 when viewed from the first direction D1. The connection conductor 25 is located in the opening formed through the electrode layer 21. An entire edge of the connection conductor 25 is surrounded by the electrode layer 21 when viewed from the first direction D1.

The connection conductor 25 is located between the piezoelectric layer 17a and the piezoelectric layer 17b. The electrode layer 21 and the connection conductor 25 are apart from each other. The connection conductor 25 opposes the external electrode 13 in the first direction D1. The via conductor 31 is connected to not only the external electrode 13 but also the connection conductor 25. The connection conductor 25 is electrically connected to the electrode layer 22 through a via conductor 32. The connection conductor 25 opposes the electrode layer 22 in the first direction D1. The via conductor 32 is connected to not only the connection conductor 25 but also the electrode layer 22.

The electrode layer 22 is electrically connected to a connection conductor 26 through a via conductor 33. The connection conductor 26 is located in the same layer that the electrode layer 23 is located. The connection conductor 26 is located inside the electrode layer 23. An opening is formed through the electrode layer 23 at a position corresponding to the external electrode 13 (connection conductor 25) when viewed from the first direction D1. The connection conductor 26 is located in the opening formed through the electrode layer 23. An entire edge of the connection conductor 26 is surrounded by the electrode layer 23 when viewed from the first direction D1.

The connection conductor 26 is located between the piezoelectric layer 17c and the piezoelectric layer 17d. The electrode layer 23 and the connection conductor 26 are apart from each other. The connection conductor 26 opposes the electrode layer 22 in the first direction D1. The via conductor 33 is connected to not only the electrode layer 22 but also the connection conductor 26. The connection conductor 26 is electrically connected to the electrode layer 24 through a via conductor 34. The connection conductor 26 opposes the electrode layer 24 in the first direction D1. The via conductor 34 is connected to not only the connection conductor 26 but also the electrode layer 24.

The external electrode 15 is electrically connected to the electrode layer 21 through a via conductor 35. The electrode layer 21 opposes the external electrode 15 in the first direction D1. The via conductor 35 is connected to not only the external electrode 15 but also the electrode layer 21.

The electrode layer 21 is electrically connected to a connection conductor 27 through a via conductor 36. The connection conductor 27 is located in the same layer that the electrode layer 22 is located. The connection conductor 27 is located inside the electrode layer 22. An opening is formed through the electrode layer 22 at a position corresponding to the external electrode 15 when viewed from the first direction D1. The connection conductor 27 is located in the opening formed through the electrode layer 22. An entire edge of the connection conductor 27 is surrounded by the electrode layer 22 when viewed from the first direction D1.

The connection conductor 27 is located between the piezoelectric layer 17b and the piezoelectric layer 17c. The electrode layer 22 and the connection conductor 27 are apart from each other. The connection conductor 27 opposes the electrode layer 21 in the first direction D1. The via conductor 36 is connected to not only the electrode layer 21 but also the connection conductor 27. The connection conductor 27 is electrically connected to the electrode layer 23 through a via conductor 37. The connection conductor 27 opposes the electrode layer 23 in the first direction D1. The via conductor 37 is connected to not only the connection conductor 27 but also the electrode layer 23.

The electrode layer 23 is electrically connected to a connection conductor 28 through a via conductor 38. The connection conductor 28 is located in the same layer that the electrode layer 24 is located. The connection conductor 28 is located inside the electrode layer 24. An opening is formed through the electrode layer 24 at a position corresponding to the external electrode 15 when viewed from the first direction D1. The connection conductor 28 is located in the opening formed through the electrode layer 24. An entire edge of the connection conductor 28 is surrounded by the electrode layer 24 when viewed from the first direction D1.

The connection conductor 28 is located between the piezoelectric layer 17d and the piezoelectric layer 17e. The electrode layer 24 and the connection conductor 28 are apart from each other. The connection conductor 28 opposes the electrode layer 23 in the first direction D1. The via conductor 38 is connected to not only the electrode layer 23 but also the connection conductor 28.

The external electrode 13 is electrically connected to the via conductor 31, the connection conductor 25, the via conductor 32, the electrode layer 22, the via conductor 33, the connection conductor 26, the via conductor 34, and the electrode layer 24. The external electrode 15 is electrically connected to the via conductor 35, the electrode layer 21, the via conductor 36, the connection conductor 27, the via conductor 37, the electrode layer 23, the via conductor 38, and the connection conductor 28. The reinforcing layers 12 are apart from and not electrically connected to any of the external electrodes 13, 15, the electrode layers 21, 22, 23, 24, the connection conductors 25, 26, 27, 28, and the via conductors 31, 32, 33, 34, 35, 36, 37, 38.

The connection conductors 25, 26, 27, 28 and the via conductors 31, 32, 33, 34, 35, 36, 37, 38 are each made of a conductive material. Examples of the conductive material include Ag, Pd, and an Ag—Pd alloy. The connection conductors 25, 26, 27, 28 and the via conductors 31, 32, 33, 34, 35, 36, 37, 38 are each constituted as, for example, a sintered body of a conductive paste containing the above-described conductive material. The connection conductors 25, 26, 27, 28 have a rectangular shape when viewed from the first direction D1. The via conductors 31, 32, 33, 34, 35, 36, 37, 38 result from sintering a conductive paste filling a through hole that is formed through a ceramic green sheet used for forming the piezoelectric layers 17a, 17b, 17c, 17d.

On the main surface 11b of the piezoelectric body 11, neither a conductor electrically connected to the electrode layers 21, 23 nor a conductor electrically connected to the electrode layers 22, 24 is disposed. In the present embodiment, when viewed from the first direction D1, the main surface 11b is wholly exposed. The main surfaces 11a, 11b are natural surfaces. The natural surface is a surface constituted by a surface formed of crystal grains developed by firing.

On each of the side surfaces 11c, 11e of the piezoelectric body 11, neither a conductor electrically connected to the electrode layers 21, 23 nor a conductor electrically connected to the electrode layers 22, 24 is disposed. In the present embodiment, when viewed from the second direction D2, each of the side surfaces 11c is wholly exposed. When viewed from the third direction D3, each of the side surfaces 11e is wholly exposed. In the present embodiment, each of the side surfaces 11c, 11e is also a natural surface.

A region between the electrode layer 21 and the electrode layer 22 in the piezoelectric layer 17b, a region between the electrode layer 22 and the electrode layer 23 in the piezoelectric layer 17c, and a region between the electrode layer 23 and the electrode layer 24 in the piezoelectric layer 17d constitute an active region that is piezoelectrically active. That is, in the piezoelectric body 11, such an active region is formed between the electrode layer 21 and the electrode layer 22, between the electrode layer 22 and the electrode layer 23, and between the electrode layer 23 and the electrode layer 24. When viewed from the first direction D1, outer edges of the electrode layers 21, 22, 23, 24 serve as a boundary between the active region and an inactive region that is piezoelectrically inactive.

In the present embodiment, the active region is located in such a way as to surround the plurality of external electrodes 13, 15 when viewed from the first direction D1. When viewed from the first direction D1, the piezoelectric body 11 has the active region in a region located between the external electrode 13 and the external electrode 15. When viewed from the first direction D1, the piezoelectric body 11 has the active region outside regions where the external electrode 13 and the external electrode 15 are located.

The vibrating member 60 has main surfaces 60a, 60b that oppose each other. In the present embodiment, the vibrating member 60 is a plate-like member. The vibrating member 60 is made of, for example, metal. The vibrating member 60 is made of, for example, a Ni—Fe alloy, Ni, brass, or stainless steel. Each of the main surfaces 60a, 60b has an oblong shape having a pair of long sides and a pair of short sides. That is, the vibrating member 60 has an oblong shape having a pair of long sides and a pair of short sides in plan view. In the present embodiment, a long-side direction of the main surfaces 60a, 60b coincides with the third direction D3. A short-side direction of the main surfaces 60a, 60b coincides with the second direction D2. A length of the vibrating member 60 in the second direction D2 is, for example, 15 mm. A length of the vibrating member 60 in the third direction D3 is, for example, 30 mm. A length of the vibrating member 60 in the first direction D1 is, for example, 100 μm.

The piezoelectric element 10 is bonded to the vibrating member 60 with the resin layer 61. The main surface 11b of the piezoelectric body 11 and the main surface 60a of the vibrating member 60 oppose each other. The resin layer 61 is located between the main surface 11b and the main surface 60a. The main surface 11b and the main surface 60a are bonded to each other with the resin layer 61. The resin layer 61 is made of resin (for example, an epoxy resin or an acrylic resin). The resin layer 61 does not contain a conductive filler and accordingly has an electrical insulation property. In a state where the piezoelectric element 10 is bonded to the vibrating member 60, the first direction D1 and a direction in which the main surface 60a and the main surface 60b oppose each other are substantially the same. When viewed from the first direction D1, the piezoelectric element 10 is disposed substantially at a center of the vibrating member 60 (main surface 60a).

As described above, in the piezoelectric body 11, the active region is formed between the electrode layer 21 and the electrode layer 22, between the electrode layer 22 and the electrode layer 23, and between the electrode layer 23 and the electrode layer 24. When viewed from the first direction D1, the outer edges of the electrode layers 21, 22, 23, 24 serve as a boundary between the active region and the inactive region that is piezoelectrically inactive. Accordingly, stress produced by displacement during driving the piezoelectric element 10 tends to be concentrated on the outer edges, particularly the corners A, of the electrode layers 21, 22, 23, 24. However, in the piezoelectric element 10, the reinforcing layers 12 overlapping the corners A of the electrode layers 21, 22, 23, 24 are provided on the main surface 11a when viewed from the first direction D1. This causes the corners A to be reinforced by the reinforcing layers 12, which makes it possible to suppress concentration, on the corners A, of the stress produced by the displacement during driving the piezoelectric element 10. This in turn makes it possible to suppress cracks in the piezoelectric body 11.

The reinforcing layers 12 are provided, for example, before polarization processing on the piezoelectric body 11. When viewed from the first direction D1, the outer edges of the electrode layers 21, 22, 23, 24 serve as a boundary between a polarized region and an unpolarized region. Accordingly, stress produced by the polarization processing tends to be concentrated on the outer edges, particularly the corners A, of the electrode layers 21, 22, 23, 24. When the reinforcing layers 12 are provided before the polarization processing, it is possible to suppress the concentration, on the corners A, of the stress produced by the polarization processing. This makes it possible to further suppress cracks in the piezoelectric body 11.

Each of the reinforcing layers 12 results from, for example, applying a conductive paste to a green sheet to be the piezoelectric layer 17a and then firing the conductive paste together with the green sheet. When the conductive paste to be the electrode layers 21, 22, 23, 24 is fired together with the green sheet to be the piezoelectric layers 17a, 17b, 17c, 17d, 17e, stress produced by a difference in heat shrinkage between the conductive paste and the green sheet may be concentrated on an outer edge, particularly corners, of the conductive paste. However, when the conductive paste to be the reinforcing layers 12 is provided on the green sheet before being fired, it is possible to suppress the concentration, on the corners of the conductive paste, of the stress produced by the difference in heat shrinkage. This makes it possible to further suppress cracks in the piezoelectric body 11.

When viewed from the first direction D1, the reinforcing layers 12 have the first region R1 overlapping the corners A of the electrode layers 21, 22, 23, 24 and the second region R2 adjacent to the corners A outside the electrode layers 21, 22, 23, 24. This allows the reinforcing layers 12 to effectively suppress cracks originating from the corners A of the electrode layers 21, 22, 23, 24.

When viewed from the first direction D1, each of the electrode layers 21, 22, 23, 24 has a rectangular shape, and the four reinforcing layers 12 corresponding to the four corners of the electrode layers 21, 22, 23, 24 are provided on the main surface 11a. This makes it possible to reliably suppress cracks in the piezoelectric body 11.

The corners A of the electrode layers 21, 22, 23, 24 are round. This makes it possible to further suppress concentration, on the corners A, of the stress produced by displacement or the like during driving the piezoelectric element 10. This in turn makes it possible to further suppress cracks in the piezoelectric body 11.

The reinforcing layers 12 are harder than the piezoelectric body 11. This makes it possible to further suppress cracks in the piezoelectric body 11.

The piezoelectric layer 17a disposed between the electrode layer 21 and the main surface 11a has transparency allowing the electrode layer 21 to be visually recognized through the piezoelectric layer 17a. This makes it easy to provide the reinforcing layers 12 at positions overlapping the corners A of the electrode layer 21.

Since the vibrating device 1 includes the piezoelectric element 10, cracks in the piezoelectric body 11 can be suppressed.

The present invention is not necessarily limited to the embodiment described above, and various modifications can be made without departing from the scope of the invention.

Figure 6A:
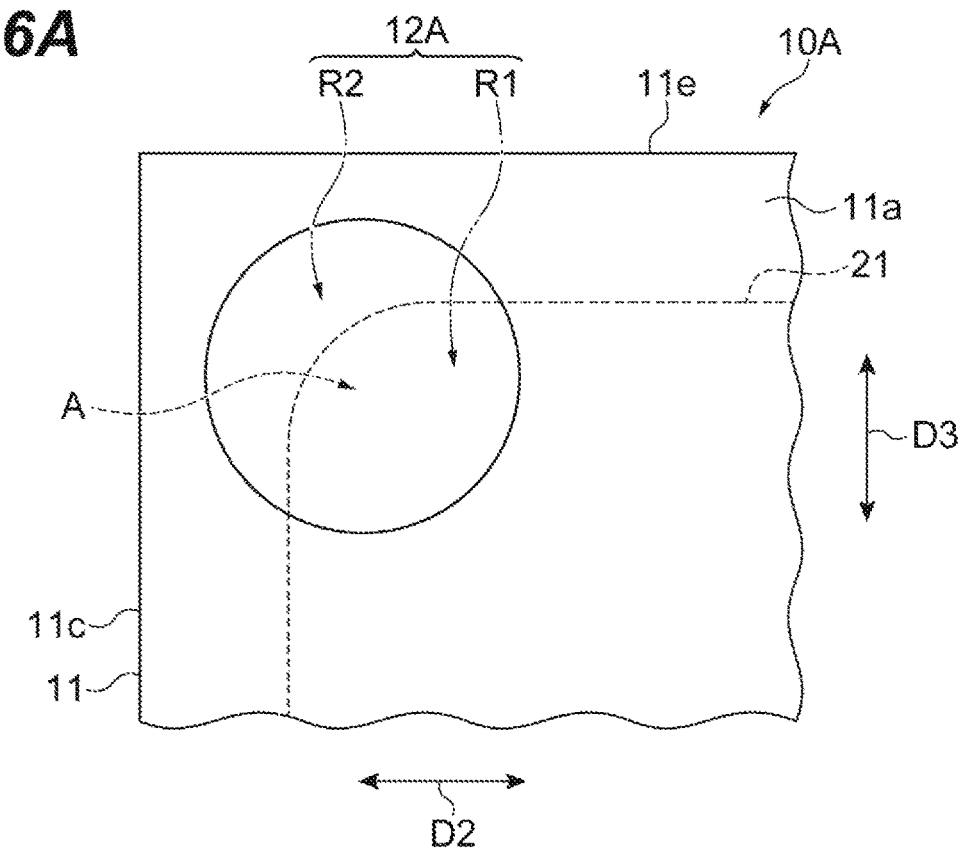
FIG. 6A is a plan view showing a partially enlarged piezoelectric element according to a first modification.

FIG. 6A is a plan view showing a partially enlarged piezoelectric element according to a first modification. The piezoelectric element 10 according to the embodiment includes, as shown in FIG. 4, the reinforcing layer 12 having a triangular shape when viewed from the first direction D1, whereas a piezoelectric element 10A according to the first modification includes, as shown in FIG. 6A, a reinforcing layer 12A having a circular shape when viewed from the first direction D1. The reinforcing layer 12A is apart from all the edges (four sides) of the main surface 11a when viewed from the first direction D1. The reinforcing layer 12A has no corner. This allows the piezoelectric element 10A to suppress, for example, concentration, on an outer edge of the reinforcing layer 12A, of stress produced by a difference in heat shrinkage between a conductive paste to be the reinforcing layer 12A and the green sheet to be the piezoelectric body 11. This in turn makes it possible to suppress cracks in the piezoelectric body 11.

Figure 6B:
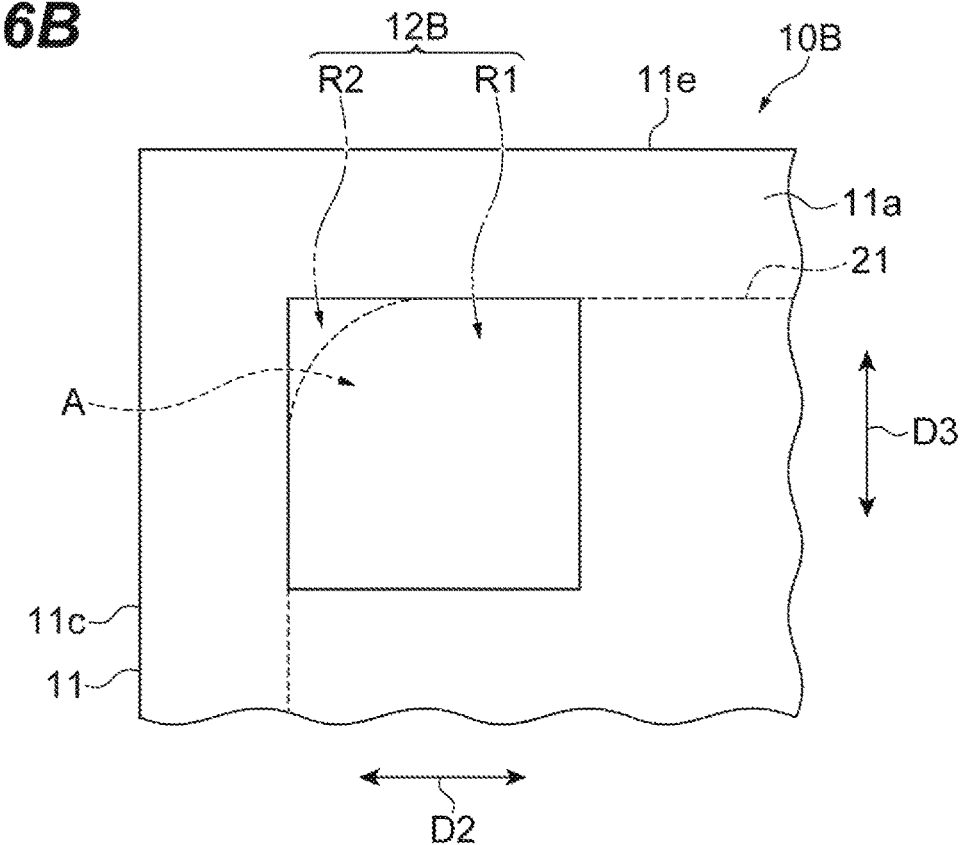
FIG. 6B is a plan view showing a partially enlarged piezoelectric element according to a second modification.

FIG. 6B is a plan view showing a partially enlarged piezoelectric element according to a second modification. The piezoelectric element 10 according to the embodiment includes, as shown in FIG. 4, the reinforcing layer 12 having a triangular shape when viewed from the first direction D1, whereas a piezoelectric element 10B according to the second modification includes, as shown in FIG. 6B, a reinforcing layer 12B having a rectangular shape when viewed from the first direction D1. When viewed from the first direction D1, the reinforcing layer 12B has, for example, a square shape. When viewed from the first direction D1, two adjacent sides of an outer edge of the reinforcing layer 12B each overlap a corresponding one of straight portions of the two sides forming the corner A. The reinforcing layer 12B is apart from all the edges (four sides) of the main surface 11a when viewed from the first direction D1. The conductive paste to be the electrode layer 21 is applied, by screen printing, to the green sheet to be the piezoelectric layer 17b, for example. Even when the printed pattern is deformed and accordingly the corner A of the electrode layer 21 becomes a large round shape, the reinforcing layer 12B easily overlaps the corner A.

Figure 7A:
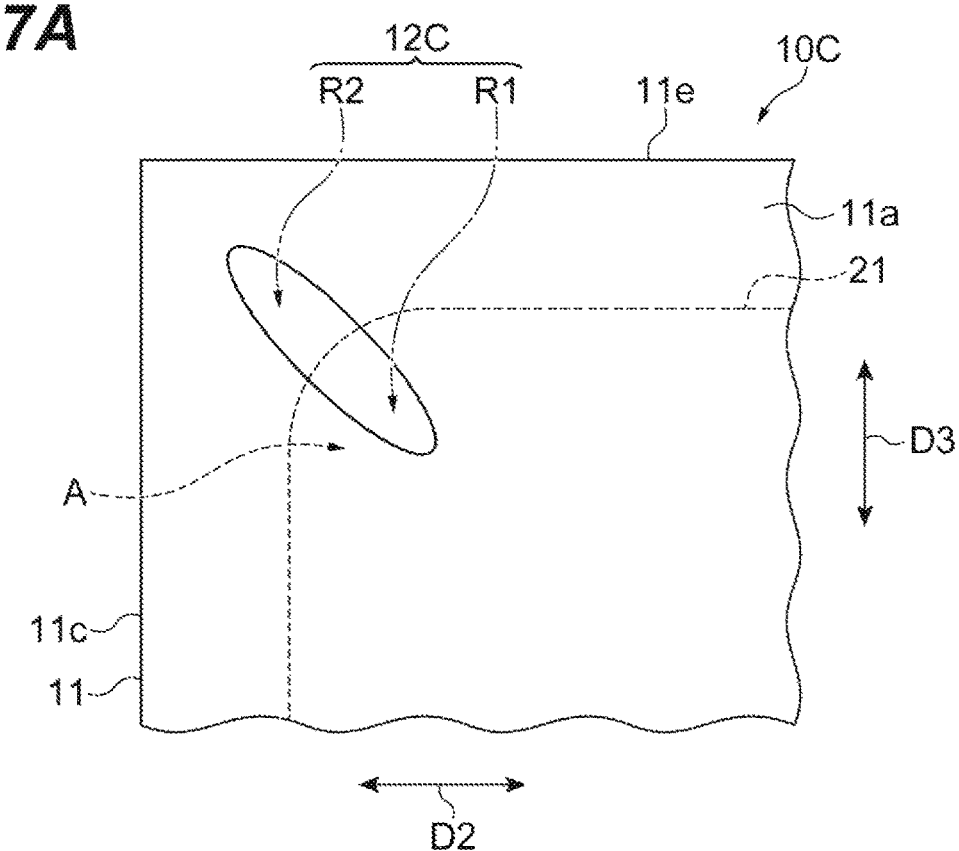
FIG. 7A is a plan view showing a partially enlarged piezoelectric element according to a third modification.

FIG. 7A is a plan view showing a partially enlarged piezoelectric element according to a third modification. The piezoelectric element 10 according to the embodiment includes, as shown in FIG. 4, the reinforcing layer 12 having a triangular shape when viewed from the first direction D1, whereas a piezoelectric element 10C according to the third modification includes, as shown in FIG. 7A, a reinforcing layer 12C having an elliptical shape when viewed from the first direction D1. When viewed from the first direction D1, the reinforcing layer 12C is disposed in such a way that a major axis of the ellipse intersects the outer edge of the electrode layer 21. The reinforcing layer 12C is apart from all the edges (four sides) of the main surface 11a when viewed from the first direction D1. The reinforcing layer 12C is capable of reinforcing a region extending up to the vicinity of the corner of the main surface 11a.

Figure 7B:
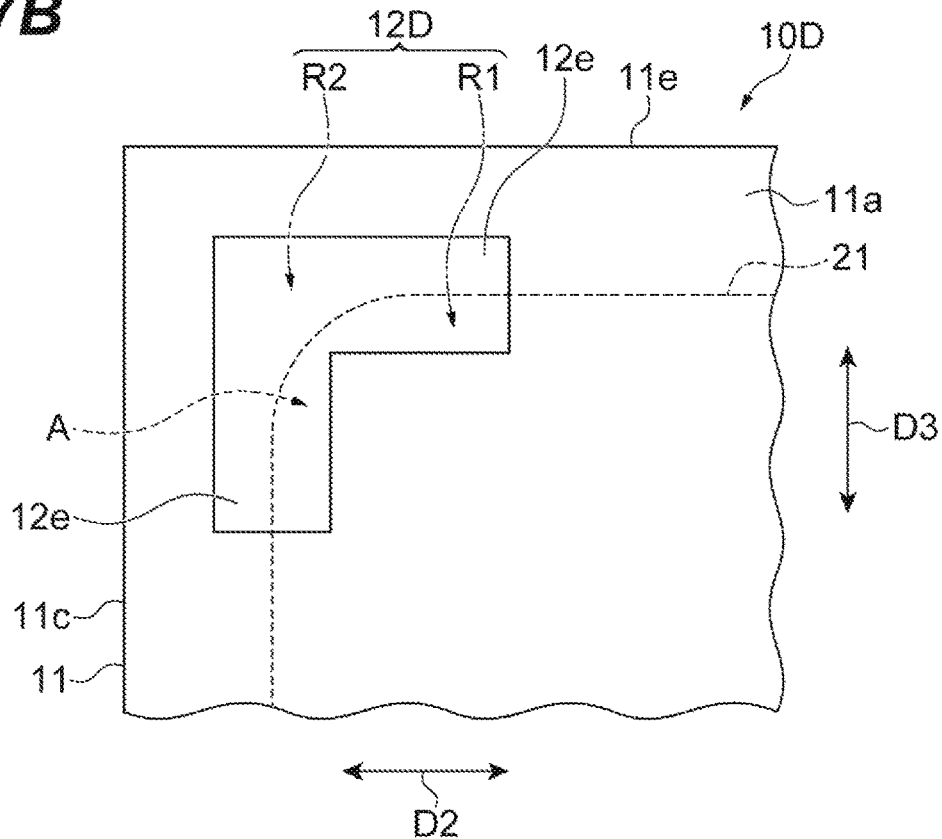
FIG. 7B is a plan view showing a partially enlarged piezoelectric element according to a fourth modification.

FIG. 7B is a plan view showing a partially enlarged piezoelectric element according to a fourth modification. The piezoelectric element 10 according to the embodiment includes, as shown in FIG. 4, the reinforcing layer 12 having a triangular shape when viewed from the first direction D1, whereas a piezoelectric element 10D according to the fourth modification includes, as shown in FIG. 7B, a reinforcing layer 12D having a V shape when viewed from the first direction D1. When viewed from the first direction D1, the reinforcing layer 12D extends along two sides forming the corner A, and includes a pair of extension portions 12e overlapping the two sides. The reinforcing layer 12D is capable of further reinforcing the two sides forming the corner A.

In the piezoelectric elements 10, 10A, 10B, 10C, 10D, the outer edges of the electrode layers 21, 22, 23, 24 have the same shape when viewed from the first direction D1 and are aligned with each other, but may have different shapes and be disposed in such a way as to be displaced from each other. In this configuration, the reinforcing layers 12, 12A, 12B, 12C, 12D may be each provided in such a way as to overlap at least one corner A of the electrode layers 21, 22, 23, 24.

In the piezoelectric elements 10, 10A, 10B, 10C, 10D, when viewed from the first direction D1, the electrode layers 21, 22, 23, 24 have a rectangular shape, and the four reinforcing layers 12 each associated with a corresponding one of the four corners of the electrode layers 21, 22, 23, 24 are provided, but it is sufficient that at least one reinforcing layer 12 be provided. The electrode layers 21, 22, 23, 24 may have at least one corner A when viewed from the first direction D1.

What is claimed is:

1. A piezoelectric element comprising:
    a piezoelectric body having a first main surface, a second main surface, and a side surface;
    an electrode layer located inside the piezoelectric body; and
    a reinforcing layer provided on the first main surface, wherein
    the first main surface and the second main surface oppose each other,
    the side surface extends in an opposing direction in which the first main surface and the second main surface oppose each other in such a way as to connect the first main surface and the second main surface,
    the electrode layer is spaced apart from the side surface,
    the first main surface is interposed between the electrode layer and the reinforcing layer,
    when viewed from the opposing direction, the electrode layer has a corner, and
    when viewed from the opposing direction, the reinforcing layer overlaps the corner.

2. The piezoelectric element according to claim 1, wherein
    when viewed from the opposing direction, the reinforcing layer has a first region overlapping the corner and a second region adjacent to the corner outside the electrode layer.

3. The piezoelectric element according to claim 1, wherein
    when viewed from the opposing direction, the electrode layer has a rectangular shape, and
    the first main surface is provided with four of the reinforcing layers corresponding to four of the corners of the electrode layer.

4. The piezoelectric element according to claim 1, wherein
    the corner is round.

5. The piezoelectric element according to claim 1, wherein
    the reinforcing layer has a hardness that is greater than a hardness of the piezoelectric body.

6. The piezoelectric element according to claim 1, wherein the piezoelectric body includes a piezoelectric layer disposed between the electrode layer and the first main surface, and the piezoelectric layer has transparency allowing the electrode layer to be visually recognized through the piezoelectric layer.

7. The piezoelectric element according to claim 1, wherein the reinforcing layer has a third main surface protruding from the first main surface, and a fourth main surface opposing the third main surface and buried in the piezoelectric body.

8. A vibrating device comprising the piezoelectric element according to claim 1 and a vibrating member to which the piezoelectric element is bonded.

9. A piezoelectric element comprising:

a piezoelectric body having a first main surface, a second main surface, and a side surface;

an electrode layer located inside the piezoelectric body; and an outer layer provided on the first main surface, wherein the first main surface and the second main surface oppose each other, the side surface extends in an opposing direction in which the first main surface and the second main surface oppose each other in such a way as to connect the first main surface and the second main surface, the electrode layer is spaced apart from the side surface, the first main surface is interposed between the electrode layer and the outer layer, when viewed from the opposing direction, the electrode layer has a corner, and when viewed from the opposing direction, the layer overlaps the corner of the electrode corner.

10. The piezoelectric element according to claim 1, wherein the reinforcing layer has a Young's modulus that is greater than a Young's modulus of the piezoelectric body.

* * * * *